United States Patent [19]

Landsittel

[11] 4,100,675

[45] Jul. 18, 1978

[54] NOVEL METHOD AND APPARATUS FOR HERMETIC ENCAPSULATION FOR INTEGRATED CIRCUITS AND THE LIKE

[75] Inventor: David Thomas Landsittel, New Providence, N.J.

[73] Assignee: Mansol Ceramics Company, Belleville, N.J.

[21] Appl. No.: 737,286

[22] Filed: Nov. 1, 1976

[51] Int. Cl.$^2$ .............................................. H05K 3/28
[52] U.S. Cl. ........................................ 29/627; 29/588
[58] Field of Search ................................. 29/627, 588

[56] References Cited

U.S. PATENT DOCUMENTS

| | | | |
|---|---|---|---|
| 3,195,026 | 7/1965 | Wegner et al. | 29/588 |
| 3,276,854 | 10/1966 | Felker et al. | 29/588 |
| 3,436,451 | 4/1969 | Wasser | 29/627 |
| 3,698,073 | 10/1972 | Helda | 29/627 |
| 3,780,429 | 12/1973 | Friebel et al. | 29/627 |
| 3,988,825 | 11/1976 | Fuchs et al. | 29/588 |

Primary Examiner—Lowell A. Larson
Attorney, Agent, or Firm—Ostrolenk, Faber, Gerb & Soffen

[57] ABSTRACT

The base assembly of a dual in-line encapsulation package (DIP) is provided with a mounting surface such that the upper ends of the package pins are flat and are flush with the flat upper surface of the base enabling one-stage bonding of the integrated circuit chip to the inner leads of a lead frame and subsequently for one-stage bonding of the outer leads of the lead frame to the in-line pins of the encapsulation package.

The configuration of the package lid and the hermetic sealing of the lid to the base yields a package having a double protection seal arrangement in which each pin seal is isolated from the encapsulated chip.

13 Claims, 12 Drawing Figures

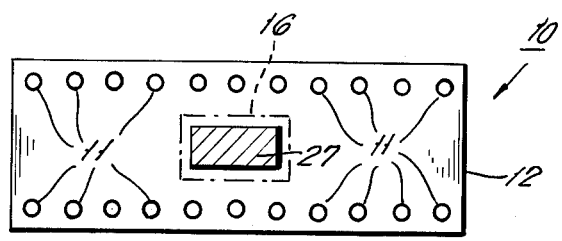
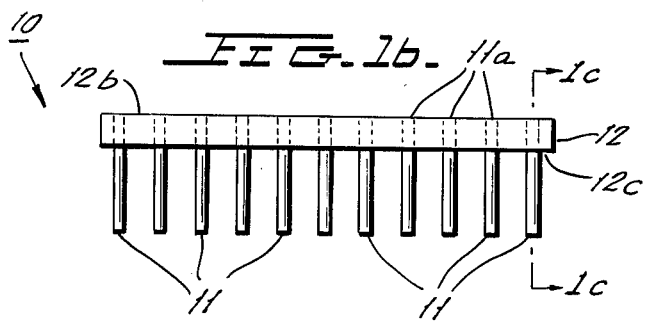
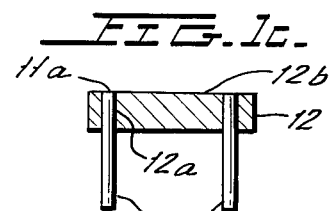
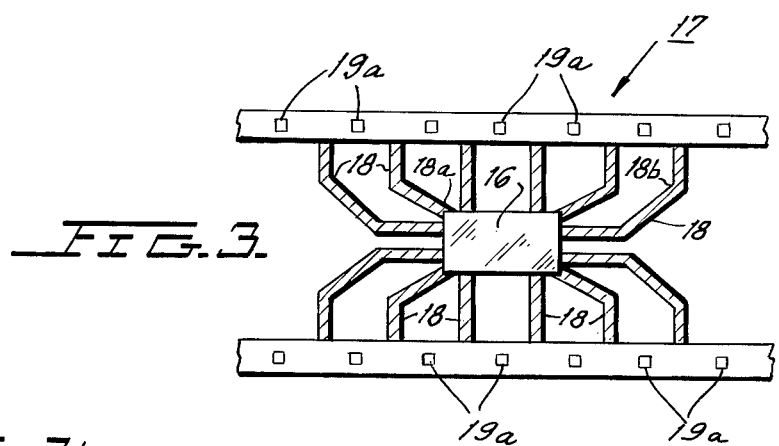
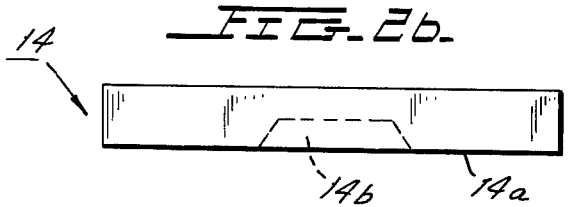
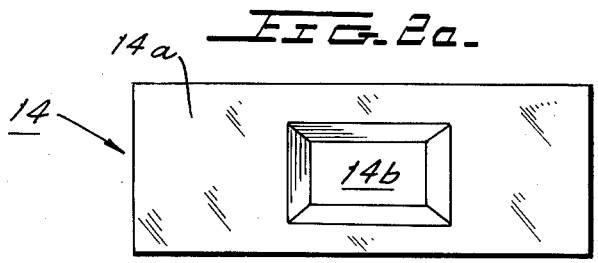
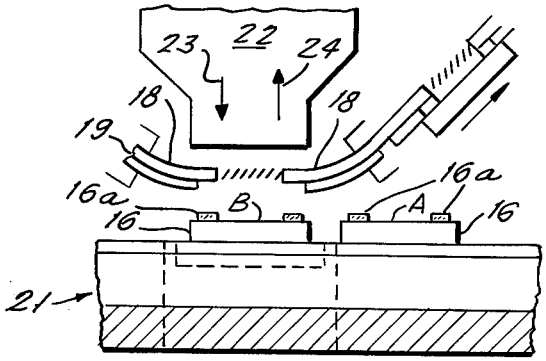

NOVEL METHOD AND APPARATUS FOR HERMETIC ENCAPSULATION FOR INTEGRATED CIRCUITS AND THE LIKE

BACKGROUND OF THE INVENTION

A variety of sophisticated equipment has been developed in order to provide for high volume production of integrated circuits. Obviously, it is the objective of such equipment to reduce or eliminate as many of the manual tasks within an operating phase as is practically possible. In addition thereto, automated equipment and materials used therein have been developed in order to reduce the number of steps employed within each phase of the process.

In one conventional technique, a bonding method employing a film-like chip carrier has been successfully developed in which a relatively thin metallic foil, which ultimately serves as the chip leads, is preferably releasably bonded to a plastic film which serves as the chip lead carrier. Both the foil and the film are treated so as to form the lead configuration (in the case of the foil) and form the substrate for supporting the lead frame (in the case of the film), which carrier thereby resembles the lead pattern. Sprockets are also formed in the carrier tape edges to permit high-speed automated handling of the lead frames (which are quite small and quite fragile) in much the same fashion as the handling or advancement of photographic film.

The chips to be mounted to each lead frame are typically bonded to the inner ends of the leads, usually by thermocompression bonding. Alternatively, ultrasonics reflow soldering, welding, or eutectic bonding techniques may be employed.

Once the above automated operation is completed, the chips, after being mounted to the chip lead frames, undergo an automated operation typically referred to as outer lead bonding, in order to connect the film carrier beam to a more rugged DIP (dual in-line package) lead frame, hybrid substrate or a printed circuit board which may be of either the rigid or flexible type. In the lead frame operation, the frame carrying a chip is typically punched away from the tape, brought into alignment with the lead frame and then bonded, preferably through thermocompression bonding, to the lead frame, the lead frames also preferably being arranged in a continuous tape-like fashion to facilitate automated handling. Thereafter, the lead frames of each completed assembly are severed from one another and secured to DIPs (also by thermocompression bonding, for example). Most applications at present utilize injection molded plastic packages which do not provide a hermetic seal for the DIPs.

It can also be seen from the foregoing description that at least two separate bonding steps are required to complete the mounting of an integrated circuit chip within a DIP. In addition, an intermediate conductor structure is required to provide connections between the integrated circuit and the ends of a DIP, namely the conductive foil lead pattern whose inner ends are connected to the chip; and the DIP lead frame whose inner ends are connected to the outer ends of the chip lead frame.

BRIEF DESCRIPTION OF THE INVENTION AND OBJECTS

The present invention is characterized by providing a novel package and process of assembling DIPs, in which the number of bonding stages and the number of components required in assembly of DIPs are reduced, thus reducing the overall assembly steps as well as enhancing hermeticity and hence reliability at the end product as a result of the novel package design.

In the present invention, the DIP base is formed of a ceramic or glass material and is molded in such a manner that the mounting surface or head of each pin is planar and is flush with the surface of the base. The elimination of any surface irregularities enables a chip lead frame to be directly bonded to the pins of the encapsulation package thus eliminating both the heavier and more rugged DIP lead frame as well as the bonding steps otherwise required to bond the DIP lead frame inner leads to the chip lead frame and the DIP lead frame outer leads to the DIP pins. The chip lead frame may be a separate metal component or a silk screened conductive pattern applied directly to the base of the package. The base is formed in a controlled environment to assure that the pin mounting surfaces are flush with the dielectric material. The bonding of the outer leads of the chip frame to the pins may then be completed in a one-step process.

The arrangement of the pins is so interrelated to the recess and surrounding joining surface provided in the package lid as to provide a double protective seal arrangement wherein a first seal is created between the pins and the base member during formation of the base assembly and a second seal is formed by means of bonding the lid to the base by epoxy, solder glass or other adhesive materials which overlie each pinlead bond so as to isolate each pin seal from the chip. This arrangement assures that there is no direct path between the outside environment and the hollow center portion of the package which houses the chip so that a breakdown of the pin seal does not necessarily lead to catastrophic failure of the finished device thereby contributing to the achievement of a fully assembled package having increased life and reliability.

It is therefore one object of the invention to provide a method for producing a novel package for use in hermetically sealing integrated circuits and the like and which, due to its unique design, provides a dual protective seal to increase the hermeticity and hence the stability and reliability of the device.

Another object of the present invention is to provide a unique dual in-line package for hermetically encapsulating integrated circuits and the like wherein the package design makes possible the use of a novel method of bonding a chip lead frame to the chip and of directly bonding the chip lead frame to the pin of the dual in-line package.

BRIEF DESCRIPTION OF THE FIGURES

The above as well as other objects of the invention will become apparent when reading the accompanying description and drawings in which:

FIGS. 1a and 1b respectively show a top plan view and a side elevational view of a dual in-line package base assembly designed in accordance with the principles of the present invention.

FIG. 1c shows a sectional view of the base assembly taken along the lines 1c–1c of FIG. 1b.

FIGS. 2a and 2b respectively show a bottom plan view and a side elevational view of a lid which is designed to cooperatively form a dual in-line package assembly with the base of FIGS. 1a–1c as well as providing a unique dual protection seal.

FIG. 3 shows a top plan view of an integrated circuit chip joined to a chip lead frame of a connecting strip.

FIG. 3a shows a simplified view of equipment employed for bonding a chip to a chip lead frame.

DETAILED DESCRIPTION OF THE INVENTION

Figure 4A:
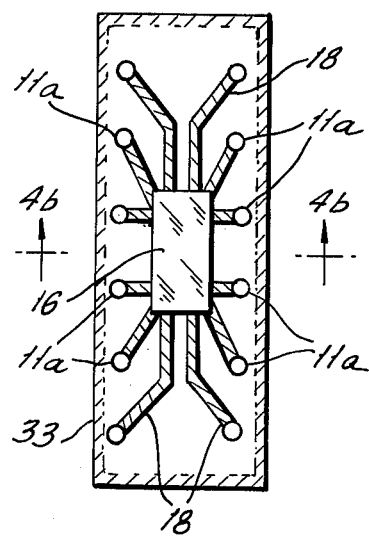
FIGS. 4a and 4b respectively show a top plan view and a side elevational view in which a chip and connecting frame sub-assembly of the type shown in FIG. 3 is mounted to a base assembly of the type shown in FIGS. 1a–1c.

The present invention deals with packaging designs and schemes for enhancing the automation of assembling standard integrated circuit chips into hermetically sealed packages without the need for extensive modification of commercially available equipment and processing techniques. The primary objective is the provision of a package design as well as the process of bonding the various integrated circuit chips to an intermediary lead frame structure which, in turn, can be bonded to the hermetic package in a single one-step operation.

The present state of the art has not developed to the extent where I-C chips may be bonded in hermetic enclosures in a high speed automated fashion. The present invention enables such automated bonding in continuous reel-to-reel form for applications wherein either individual exposed chips or non-hermetically sealed plastic encapsulated chips require hermeticity for protection of the chip. Present day chip bonding is accomplished by attaching individual wires to each contact on the chip and then, in turn, to complementary contacts on the carrier or package whereas the present invention will allow one-step bonding to the chip and one-step bonding to the pins of the package thereby eliminating the extremely costly and time-consuming individual wire bonding processes.

The base assembly 10 of the hermetic package structure is shown in FIGS. 1a–1c as being comprised of a series of pins 11 assembled and molded within a substantially rectangularshaped base 12 preferably formed of glass, glass-ceramic or ceramic material.

The glass, glass-ceramic or ceramic material preform most typically employed in dual in-line packages (DIPs) is shown in FIGS. 1l–1c, but it should be understood that this particular configuration is merely exemplary and should not be considered as restrictive as regard usage of the invention and its applications.

The process steps employed in forming the base assembly 10 comprise: forming the base member 12 within a mold under a controlled pressure during the molding and sealing process and sufficient to assure satisfactory flatness of the chip mounting surface; the individual metallic pins 11 have their bonding surfaces 11a straight-cut on each end for a minimum of 60–80% of the surface. The individual pins 11 and the preformed base member 12 are inserted within a fixture preferably formed of either carbon or graphite in order to "seal" the assembly. When sealing glass or glass-ceramic materials, the assembled unit is moved through a furnace at temperatures at a level sufficient to flow the glass or glass-ceramic materials. The sealing time and temperature are further controlled in order to maintain the molding material at a relatively low viscosity so as to further prevent the assembled unit from reaching temperature levels of the order of the working point of glass to further enhance flatness of the working surface.

During the time that the glass is molten, it makes intimate contact with the pin material thereby creating a "seal" utilizing well-established technologies. Typically this may encompass a degree of direct chemical bonding between the glass and the pin or the formation of an oxide on the pin and the provision of some degreee of compression around the pin which is caused by differential expansion and/or contraction of the glass as compared with the pin material. This is preferably obtained by selecting glass whose coefficient of contraction is slightly greater than that of the pin material. When the preform is comprised of ceramic, a metallization, usually of an active metal, is applied to the openings in the ceramic which receive the pins by any one of a number of processes prior to assembly of the pins into the preform openings. During assembly, a bracing or solder material is also placed in intimate contact with the pin and the metallized ceramic. During the heating process used to seal the base assembly, the braze or solder material flows and bonds directly to the pin material and the metallized ceramic, metallization being confined to the openings 12a through which the pins 11 extend. Although the sealing techniques described herein constitute present day technology, the design of the base itself and its inherent characteristics play an important role in the unique advantages derived from the final fully-assembled package as well as leading to a significant reduction in the number of method steps required to hermetically encapsulate an integrated circuit chip.

As can best be seen from a consideration of FIGS. 1b and 1c, the surfaces 11a of pins 11 are flush with the surface 12b of the dielectric member. Any significant degree of overflush or underflush conditions resulting prior to or subsequent to sealing will yield untenable bonding problems later in the assembly process. It is further of vital importance that there be no glass or ceramic material left remaining deposited upon the surface 11a of each pin since this would impede bonding if not make it altogether impossible to obtain a bond.

Although the pins 12 are shown in FIGS. 1a and 1c as being straight, the external portion extending beneath the lower surface 12c of base 12 may be formed in any desired configuration to conform with standard industry specifications, the final configuration (straight or bent) typically being determined by the requirements of the end user.

FIGS. 2a and 2b show the lid 14 designed to cooperate with the base assembly 10 of FIGS. 1a–1c collectively forming the encapsulating assembly. The lid may be formed of the same material as the base (i.e., glass, glass-ceramic or ceramic materials). The undersurface 14a is provided with a centrally located recess 14b extending into the body of the lid to a depth sufficient to allow clearance for the integrated circuit chip which is ultimately housed within the package in a manner to be more fully described. The balance of the undersurface 14a of lid 14 surrounding recess 14b is designed so that when covering the base, the remaining surface covers that area immediately adjacent to each and every one of the pin seals to provide a double protection seal thus making the lid design of paramount importance for the reasons set forth hereinabove.

Lid joining mechanisms and techniques at present are limited to the use of solder glass sealing or epoxy and/or other adhesive sealing materials in order to close and hermetically seal the chip within the package. The ultimate choice of material is typically established by the requirements of the end user. The manner of hermetically sealing the assembled package and obtaining the dual protection seal will be described in detail hereinbelow.

The actual die or chip bonding procedure and the manner in which the package of the present invention contributes to the significant reduction in the assembly steps will now be described.

A processed integrated circuit chip or chips are typically fed to automatic bonding equipment, for example, of the type identified as the MINIMOD film carrier technique developed by General Electric Co. and described in the publication "Electronics" and appearing at pg. 44 in the issue of Feb. 1, 1971. The integrated circuit chip 16 as shown in FIG. 3 is initially bonded to the inner ends of metallic leads 18 cooperatively forming a chip lead frame pattern 17 typically formed of a copper foil and mounted upon an insulating (i.e., plastic) substrate typically referred to as a carrier strip. At present, the most commonly used organic carrier strips are of polyamide, polyester or polyether sulfone. The carrier strip and the lead patterns have a similar configuration. The elongated sides of the carrier strip are provided with openings substantially similar to the sprocket holes provided in photographic film strips. The conductive foil pattern 17 may be directly secured to the carrier strip or may be secured through the employment of an adhesive. The film or carrier strip in present day film carriers preserves the configuration of the fragile copper innerconnect leads and acts as an insulator but its presence adds to the final cost of the finished assembly and as a result film strip comprised only of a copper foil unsupported by plastic film may be used as an alternative to those described hereinabove in connection with the bonding apparatus of FIG. 3a.

Thus the interconnecting pattern, whose appearance closely resembles a miniature lead frame of a film strip, is arranged so that the inner ends of the leads are aligned with the outer bonding pads or bumps provided on the semiconductor chip 16. By the use of thermocompression bonding techniques an intimate and strong bond is created between the leads of the interconnecting strip and the chip. This is accomplished by aligning the tape carrying the conductive lead patterns with the chips to be bonded thereto so that the bonding pads 16a of the chip 16 are aligned with the inner ends of the associated leads 18. The chips 16 are mounted upon a substrate forming part of the bonding equipment 21. A bonding thermode 22 is then moved downwardly in a direction shown by arrow 23 so that the inner ends of the leads 18 are urged into intimate engagement with associated ones of the bonding pads 16a. Controlled heat and pressure are then applied to simultaneously join all of the inner ends of the leads 18 to the bonding pads 16. Thereafter, the thermode 22 is moved upwardly in the direction of arrow 24 while the substrate 21 is moved downwardly in the direction shown by arrow 25 (the tape strip remaining substantially stationary vis-a-vis the vertical plane during the bonding operation). The chip remains with the carrier strip due to the bonding of the chip pads to the leads 18. Thereafter the chip for which the bonding operation has been completed (see chip "A" in FIG. 3a), is indexed to the right from the bonding position so as to occupy the solid line position as shown and the next chip ("B") is indexed into the bonding position whereupon the bonding operation is repeated in much the same fashion, providing an intimate and strong bond between the interconnecting strip leads 18 and the semiconductor chip.

Figure 6A:
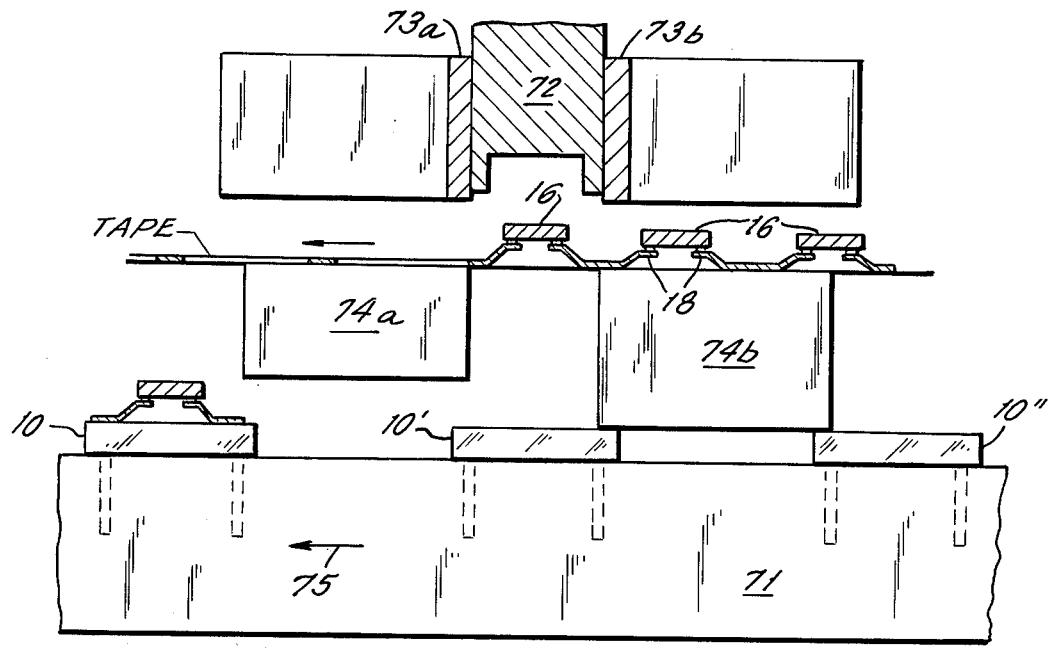
FIGS. 6a and 6b show simplified views of apparatus for bonding chip lead frames to the pins of DIPs.
Figure 6B:
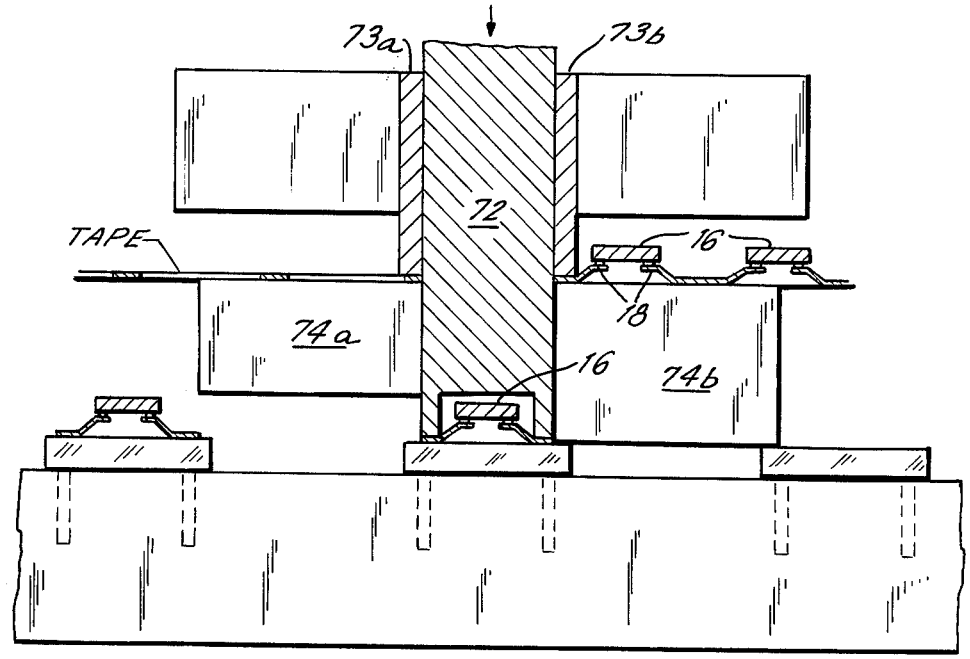

The carrier strip is still adhered to the leads and remains in the form of a film strip which is preferably mounted upon a supply reel in much the same manner as motion picture film, for example. The chip-reel combination is fed to a second bonding machine wherein the external or outer ends of the interconnecting leads 18 are now simultaneously bonded to associated surfaces of the flush mounted sealed pins. Once again thermocompression bonding technology may be utilized to create an adequate joinder or connection between the carrier frame leads and the DIP pins 11. Considering FIGS. 6a and 6b, as well as FIG. 3a, the carrier tape is fed in much the same manner as that shown in FIG. 3a with the base assemblies occupying the positions as shown by the chips "B" and "C" on substrate 71. The carrier tape should be arranged in such a manner (i.e., "up-side-down" from the alignment of FIG. 3a) as to place the leads 18 into intimate contact with the mounting surfaces 11a of the pins 11 as shown in FIGS. 3b, 6a and 6b. The flush arrangement of the pin bonding surfaces 11a and the base upper surface 12b avoid placing any undue stresses upon the individual leads 18 as well as assuring good compression bonding. As is well known in the art, a punch member 72 is provided to punch the assembled chip and interconnecting frame away from the carrier tape and into intimate engagement with the bonding surfaces 11a of pins 11. Pressure pads 73a–73b adjacent to the punch are utilized to hold the carrier tape secure in cooperation with the dies 74a–74b, as the punch pierces the carrier tape (FIG. 7b) to sever the assembled chips and interconnected leads from the carrier strip in a neat fashion. Punch 72 urges the leads against the planar surfaces 11a and the controlled application of heat to the punch 72 completes the bonding operation. The support 71 and the carrier tape 17 advances in the direction of arrow 75 to move the next chip-frame assembly and base assembly in the bonding position.

Figure 4B:
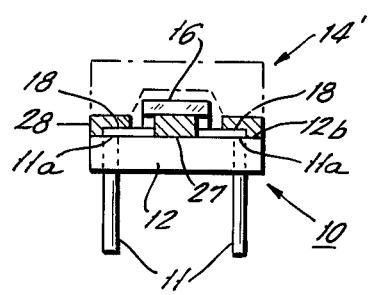

The chip, as shown in FIG. 4b, is secured to the base surface 12d by an epoxy sealant 27. In those applications where epoxy sealing of the chips in the package is not desirable, the epoxy 27 may take the form of a metallic die pad secured to the central portion of the upper base surface 12b. Alternatively, the pad may be a metallized pad formed upon the surface 12b. The metal or metallized chip bonding area is preferably coated on its bonding surface with a gold plating so that an intimate silicon-to-gold bond is created.

As shown best in FIG. 4b, the solder glass 28 employed to seal lid 14 (shown in dotted fashion) to base 10 can be seen to fill the gap region G and make intimate contact with the non-recessed surface portion of lid surface 14a surrounding recess 14b as well as engaging both the upper surface 12b of base 12 and the region immediately adjacent and surrounding the bond between the outer end of each chip lead 18 and the upper surface 11a of the associated pin joined thereto.

By covering the area immediately adjacent each pin seal a double protection seal is accomplished such that each pin seal is now isolated from chip 16 which is housed within the internal hermetically sealed space defined by recess 14d and the central portion of surface 12b. It can be seen that there is no direct path from the outside environment into the hollow center portion of the package which hermetically houses chip 16. The upper end of each pin seal (i.e., the seal between each pin 11 and the base element 12) is also further sealed by the glass solder (or other suitable hermetic sealant) forming a "second barrier" between the outside environment and the semi-conductor chip 16, such that a breakdown of the pin seal will not necessarily lead to catastrophic failure of the finished package hermetically sealing the chip, which is extremely important for providing a finished assembly having long life and reliability as well as providing a device for having high operational stability.

As was described hereinabove, the lid of the hermetic package can be joined to the base by an organic epoxy or adhesive material or commercially available solder glasses in a process similar to the CERDIP process which basically comprises sealing an upper and lower ceramic plate with the lead frame and chip sandwiched between. The solder glass wets and becomes bonded to the lead frame and ceramic, forming a hermetically sealed unit.

Figure 5:
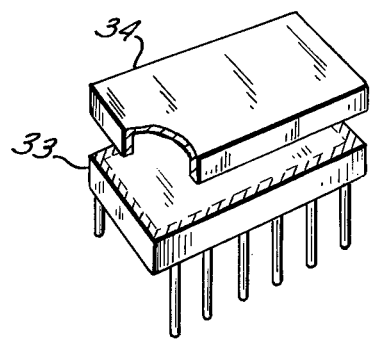
FIG. 5 shows an exploded perspective view of another preferred embodiment of the package assembly of the present invention.

The package of the present invention may also be manufactured as shown best in FIGS. 4a and 5 wherein a metallic ring 33 (shown in dotted fashion in FIG. 4a) is provided on surface 12b of base element 12 so as to completely surround the in-line pin arrangements. A metallic lid substantially of a dish-shaped design may be applied to the metal ring 33 by standard soldering or brazing techniques.

The package assembly and bonding techniques that are described herein can be performed without the need for gold bonding layers but, if gold is necessary to aid in promoting the bond between the intermediate metal carrier and the pins in the package, the amount of gold which is necessary is extremely small as compared with techniques and packaging arrangements presently in use, since the number of bonding operations and in fact the number of lead frames have been reduced yielding significant savings in cost of equipment material and manpower.

Although preferred embodiments of this novel invention have been described hereinabove, many variations and modifications will now be apparent to those skilled in the art. Therefore, this invention is to be limited, not by the specific disclosure herein, but only by the appending claims. For example, although the assembly techinque described herein embodies a highly automated system, the same procedures may be pursued on a one by one basis, and still be considered within the scope of the patent.

I claim:

1. A package assembly for hermetically sealing semiconductor type chips and the like, comprising:
    a base member formed of an insulating material and having a chip mounting surface formed on one side thereof;
    at least one row of openings formed in said base member, one end of each of said openings terminating at said mounting surface;
    a plurality of conductive pins extending through said opening, one end of each of said pins defining a lead mounting surface, a major portion of said one end of each of said pins being planar and substantially flush with said mounting surface;
    said base member including means for forming a hermetic seal between each of said pins and their associated pin openings;
    a lid formed of an insulating material having a mating surface abutting said mounting surface, said mating surface of said lid overlying said one end of said pins and including a recess formed therein, said recess defining a hollow interior volume adapted to receive a semi-conductor chip or the like; and
    sealing means located between said mating surface of said lid and said mounting surface of said base member for hermetically isolating each of said pin seals from each other and from said recess.

2. The package assembly of claim 1 wherein said chip mounting surface is planar.

3. The package assembly of claim 1 wherein said chip mounting surface is recessed.

4. The assembly of claim 1 further comprising chip mounting means for securing a circuit chip provided on said mounting surface and within said interior volume.

5. The assembly of claim 1 further including:
    a semi-conductor chip positioned within said interior volume;
    a plurality of bonding pads located on said semiconductor chip; and
    a plurality of leads, each of said leads having an inner end bonded to a different one of said bonding pads and an outer end bonded to a different one of said lead mounting surfaces of said pins.

6. The assembly of claim 5 wherein said sealing means surrounds and intimately engages said outer ends of said leads.

7. The assembly of claim 1 wherein said base member and said lid are formed of an insulating material chosen from the group consisting of glass, glass-ceramic or ceramic.

8. The assembly of claim 1 wherein said sealing means is formed of a solder glass.

9. A method of forming package assemblies for hermetically sealing semiconductor chips and the like comprising the steps of:
    forming a base member having a plurality of through openings arranged in a row and at least one flat mounting surface out of an insulative material;
    providing a plurality of conductive pins and straight-cutting a first end of each of said pins to form a flat bonding surface;
    forming an assembly by placing said pins in said openings;
    mounting said assembly in a fixture to maintain the alignment of said pins and said base member so that said bonding surfaces of said pins are maintained flush with said mounting surface of said base member;
    heating said assembly at a temperature above the flow point of said insulating material and cooling the assembly whereby said insulating material, which is selected to have a coefficient of contraction which is at least equal to and preferably greater than that of said pins, intimately surrounds and engages said pins to form a hermetic seal; and
    controlling the sealing temperature and the sealing time to maintain said insulative material at a relatively low viscosity, said sealing temperature having a maximum value below the working point of the insulative material.

10. The method of claim 9 further comprising the step of maintaining the assembly in an atmosphere which is neutral when said assembly is being heated to seal said pins.

11. The method of claim 10 wherein said atmosphere lies within the range from a slightly reducing to a slightly oxidizing atmosphere.

12. A method for hermetically sealing semiconductor chips and the like within a package assembly having a base assembly whose base mounting surface and pin is flat and flush with the flat bonding surfaces of the base assembly conductive pins comprising the steps of:

providing a chip lead frame comprised of leads mounted upon a carrier tape or screened pattern and a chip having bonding pads;

bonding the inner ends of the leads to the bonding pads in a one-step process;

positioning the carrier tape relative to the base member to align a portion of the leads extending outwardly from the chip with associated pin bonding surfaces;

punching the leads and chip away from the carrier strip and urging the aligned lead positions into imtimate engagement with the pin bonding surfaces;

maintaining the engaged lead and pin bonding surfaces under compression and applying heat thereto to bond the leads to the pins in a one-step process.

13. The method of claim 12 further comprising the steps of placing an insulating lid having a central recess upon said mounting surface so that said recess and the base mounting surface encloses the chip within an interior volume;

filling the region defined by the surface of the lid surrounding the recess and the confronting mounting surface of the base member with an insulating sealant to hermetically seal the chip within the interior volume.

* * * * *